United States Patent
Zhang et al.

(10) Patent No.: US 10,804,324 B1
(45) Date of Patent: Oct. 13, 2020

(54) 1T2R RRAM CELL AND COMMON REACTIVE ELECTRODE IN CROSSBAR ARRAY CIRCUITS

(71) Applicant: TETRAMEM INC., Newark, CA (US)

(72) Inventors: Minxian Zhang, Newark, CA (US); Ning Ge, Newark, CA (US)

( * ) Notice: Subject to any disclaimer, the term of this patent is extended or adjusted under 35 U.S.C. 154(b) by 0 days.

(21) Appl. No.: 16/521,942

(22) Filed: Jul. 25, 2019

(51) Int. Cl.
  H01L 45/02 (2006.01)
  H01L 27/24 (2006.01)
  H01L 45/00 (2006.01)

(52) U.S. Cl.
  CPC ...... H01L 27/2481 (2013.01); H01L 27/2418 (2013.01); H01L 27/2436 (2013.01); H01L 45/1206 (2013.01); H01L 45/1253 (2013.01); H01L 45/147 (2013.01)

(58) Field of Classification Search
  CPC ......... H01L 45/02; H01L 45/04; H01L 45/08; H01L 45/10; H01L 45/12; H01L 27/2481; H01L 45/1253; H01L 45/147; H01L 27/2418; H01L 45/1206; H01L 27/2436
  See application file for complete search history.

(56) References Cited

U.S. PATENT DOCUMENTS

| | | | |
|---|---|---|---|
| 2013/0043452 A1* | 2/2013 | Meyer | H01L 27/101 257/4 |
| 2014/0097397 A1* | 4/2014 | Park | H01L 45/04 257/4 |
| 2015/0188045 A1* | 7/2015 | Wang | H01L 45/08 257/4 |
| 2016/0351806 A1* | 12/2016 | Hsieh | H01L 45/085 |

* cited by examiner

*Primary Examiner* — Thanh T Nguyen

(57) ABSTRACT

Technologies relating to a crossbar array circuit with a one-transistor-two-memristor (1T2R) Resistive Random-Access Memory (RRAM) and a common reactive electrode in the applications of the crossbar array circuit are disclosed. An example crossbar array circuit includes: a two-memristor structure, wherein the two-memristor structure includes: a first bottom electrode; a first RRAM stack formed on the first bottom electrode; a top electrode formed on the first RRAM stack; a second RRAM stack formed on the top electrode; and a second bottom electrode formed on the second RRAM stack, wherein the top electrode is a reactive or scavenging electrode which is configured to provide the first RRAM stack and the second RRAM stack with oxygen vacancies near the reactive electrode; and a one-transistor structure, wherein the one-transistor structure includes: a source electrode; a gate electrode; and a drain electrode, wherein the source electrode is connected to the top electrode.

10 Claims, 7 Drawing Sheets

1T1R cell

Transistor (1T)

RRAM (1R)

1T2R RRAM CELL AND COMMON REACTIVE ELECTRODE IN CROSSBAR ARRAY CIRCUITS

TECHNICAL FIELD

The present disclosure relates generally to crossbar array circuits and more specifically to crossbar array circuits with one or more one-transistor-two-memristor (1T2R) Resistive Random-Access Memories (RRAMs) and one or more common reactive electrodes.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a HRS to a LRS is often referred to as a "Set" or "On" switch; the switching systems from a LRS to a HRS is often referred to as a "Reset" or "Off" switching process.

A Digital-to-Analog Converter (DAC) converts a digital signal into an analog signal; an Analog to Digital Convertor (ADC) converts an analog signal into a digital signal. ADCs and DACs may be used as interfacing devices between a crossbar and a digital circuit. A multiplexer (MUX) can select one of the multiple input signals, analog or digital, and forward the selected input signals to a single output line.

SUMMARY

Technologies relating to crossbar array circuits with one or more 1T2R RRAMs and one or more common reactive electrodes are provided.

A crossbar array circuit, in some implementations, includes: a two-memristor structure, wherein the two-memristor structure includes: a first bottom electrode; a first RRAM stack formed on the first bottom electrode; a top electrode formed on the first RRAM stack; a second RRAM stack formed on the top electrode; and a second bottom electrode formed on the second RRAM stack, wherein the top electrode is a reactive electrode which is configured to provide the first RRAM stack and the second RRAM stack with oxygen vacancies near the reactive electrode; and a one-transistor structure, wherein the one-transistor structure includes: a source electrode; a gate electrode; and a drain electrode, wherein the source electrode is connected to the top electrode.

The top electrode, in some implementations, is made of materials including: Ta, Hf, Zr, Ti, Nb, Ru, a combination thereof, or an alloy or other conductive materials thereof.

The first bottom electrode, in some implementations, is made of materials including: Pt, Pd, Ir, Ru, TiN, TaN, a combination thereof, or an alloy or other conductive materials thereof.

The second bottom electrode, in some implementations, is made of materials including: Pt, Pd, Ir, Ru, TiN, TaN, a combination thereof, or an alloy or other conductive materials thereof.

The first RRAM stack, in some implementations, is made of materials including: $TaO_x$, $HfO_x$, $TiO_x$, $ZrO_x$, a combination thereof, or an alloy or other dielectric materials thereof.

The second RRAM stack, in some implementations, is made of materials including: $TaO_x$, $HfO_x$, $TiO_x$, $ZrO_x$, $TaO_xN_y$, $HfO_xN_y$, $TiO_xN_y$, $ZrO_xN_y$, $TaSi_xO_y$, $HfSi_xO_y$, $TiSi_xO_y$, $ZrSi_xO_y$, $TaAl_xO_y$, $HfAl_xO_y$, $TiAl_xO_y$, $ZrAl_xO_y$, a combination thereof, or an alloy or other dielectric materials thereof.

In some implementations, the second RRAM stack is made of a material that is different from the material from which the first RRAM stack is made.

In some implementations, the second RRAM stack is selected to have a resistance to be one factor to one order higher than that of the first RRAM stack.

In some implementations, the gate electrode is connected to a first voltage source, and the drain electrode is connected to a second voltage source.

The crossbar array circuit, in some implementations, further includes: a first DAC connected to the second bottom electrode; and a first ADC connected to the first bottom electrode.

A crossbar array circuit, in some implementations, includes: a two-memristor structure, wherein the two-memristor structure includes: a first bottom electrode; a first RRAM stack formed on the first bottom electrode; a top electrode formed on the first RRAM stack; a second RRAM stack formed on the top electrode; and a second bottom electrode formed on the second RRAM stack, wherein the top electrode is a reactive electrode which is configured to provide the first RRAM stack and the second RRAM stack with oxygen vacancies near the reactive electrode; a one-transistor structure, wherein the one-transistor structure includes: a source electrode; a gate electrode; and a drain electrode, wherein the source electrode is connected to the top electrode, the gate electrode is connected to a first voltage source, and the drain electrode is connected to a second voltage source. In some implementations, a first DAC connected to the drain electrode; a MUX connected to the first bottom electrode and the second bottom electrode; and a first ADC connected to the MUX, wherein the MUX is configured to select an input signal between the first bottom electrode and the second bottom electrode and forward the input signal to the first ADC.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Technologies relating to crossbar array circuits with one or more 1T2R RRAMs and one or more common reactive electrodes and their potential applications are provided. The technologies described in the present disclosure may provide the following technical advantages.

First, the disclosed technology provides various designs of a 1T2R RRAM crossbar array circuit for a vector-matrix multiplication (VMM), such as a Dot Product Engine (DPE) application. These designs may be implemented to reduce LRS conductance by implementing one 1R as a current limiter, and another 1R as an analog RRAM, which effectively reduce operation current by at least 1 order. The lower the conductance in LRS filamentary mode of analog RRAM operations, the lower the power consumption and the better performance (such as reliability, uniformity etc.) during the VMM operation.

Second, the various designs of a 1T2R RRAM crossbar array circuit disclosed may also be implemented to double computing memory capacity by using the same set of DAC and ADC to support 2 crossbar arrays. Each crossbar array may store a matrix of conductance as weight for VMM operations. Therefore, one set of DACs and ADCs to support two cross bar arrays in VMM operation may be implemented and thus the manufacturing cost on integrated circuits can be halved.

Third, since transistor is a three terminal device, while RRAM is a two terminal device, the space occupied by a transistor can be a limiting factor in 1T1R chips. The 1T2R structure described in the present disclosure can program 2R with 1T, effectively double the utilization on each transistor.

Fourth, a common reactive electrode may be made of materials that provide both RRAM cells the oxygen vacancies within RRAM oxides near the common reactive electrode, which is suitable for the 1T2R RRAM crossbar array circuit in the present disclosure.

Conventional memristor cells often have a Metal-Insulator-Metal (MIM) structure. In the present disclosure, in contrast, a Top Electrode (TE) of a memristor cell may be designated as a reactive electrode (metal electrode with oxygen solubility) or a non-switching electrode, which is configured to create or provide oxygen vacancies in RRAM oxide near the top electrode. Therefore, the top electrode is connected to a Conductive Filament (CF) in RRAM oxide during both HRS and LRS.

Meanwhile, a Bottom Electrode (BE) is designated as a switching electrode, which is non-reactive or noble to oxygen. The bottom electrode can be connected to the CF in RRAM oxide during LRS, but not during HRS.

Figure 1B:
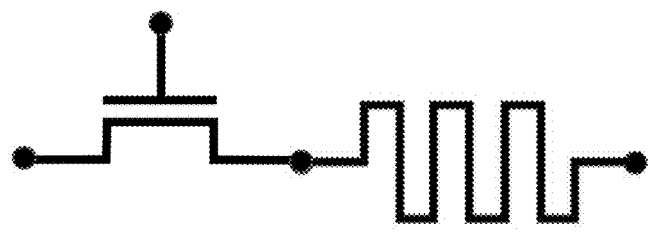
FIG. 1B is a block diagram illustrating various circuit symbols for a RRAM (1R), a transistor (1T) and a one-transistor-one-RRAM (1T1R).
Figure 1B:
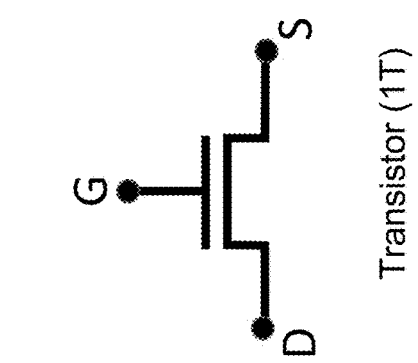
Figure 1A:
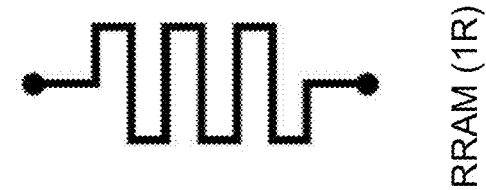
FIG. 1A is a block diagram illustrating schematically an example RRAM cell, in which an RRAM oxide is sandwiched between a Bottom Electrode (BE) and a Top Electrode (TE).
Figure 1A:
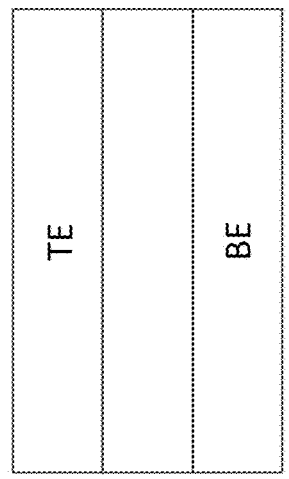

FIG. 1A is a schematic diagram illustrating an example RRAM cell, in which an RRAM oxide is sandwiched between a Bottom Electrode (BE) and a Top Electrode (TE).

In the present disclosure, a BE may function as a switching electrode or a non-reactive electrode, and a TE may function a non-switching electrode, a reactive electrode, or a scavenging electrode (to create oxygen vacancies in RRAM oxide). The Conductive Filament (CF) may be in contact with a switching electrode in an LRS and is separated from a switching electrode in an HRS, while CF is always in contact with the non-switching electrode, in both a LRS and a HRS. A switching electrode is not-reactive with oxygen, while a non-switching electrode may dissolve oxygen in an electrode and create oxygen vacancies in a RRAM oxide. A non-switching electrode may thus also be referred to as a reactive electrode or a scavenging electrode.

FIG. 1B is a block diagram illustrating various circuit symbols for a RRAM (1R), a transistor (1T) and a one-transistor-one-RRAM (1T1R). A transistor includes three terminals: a gate (G), a drain (D), and a source (S). A first voltage (gate voltage) controls the conductive path between the source and the drain. A second voltage (drain voltage) controls the current flowing through the conductive path between the source and the drain.

Figure 1C:
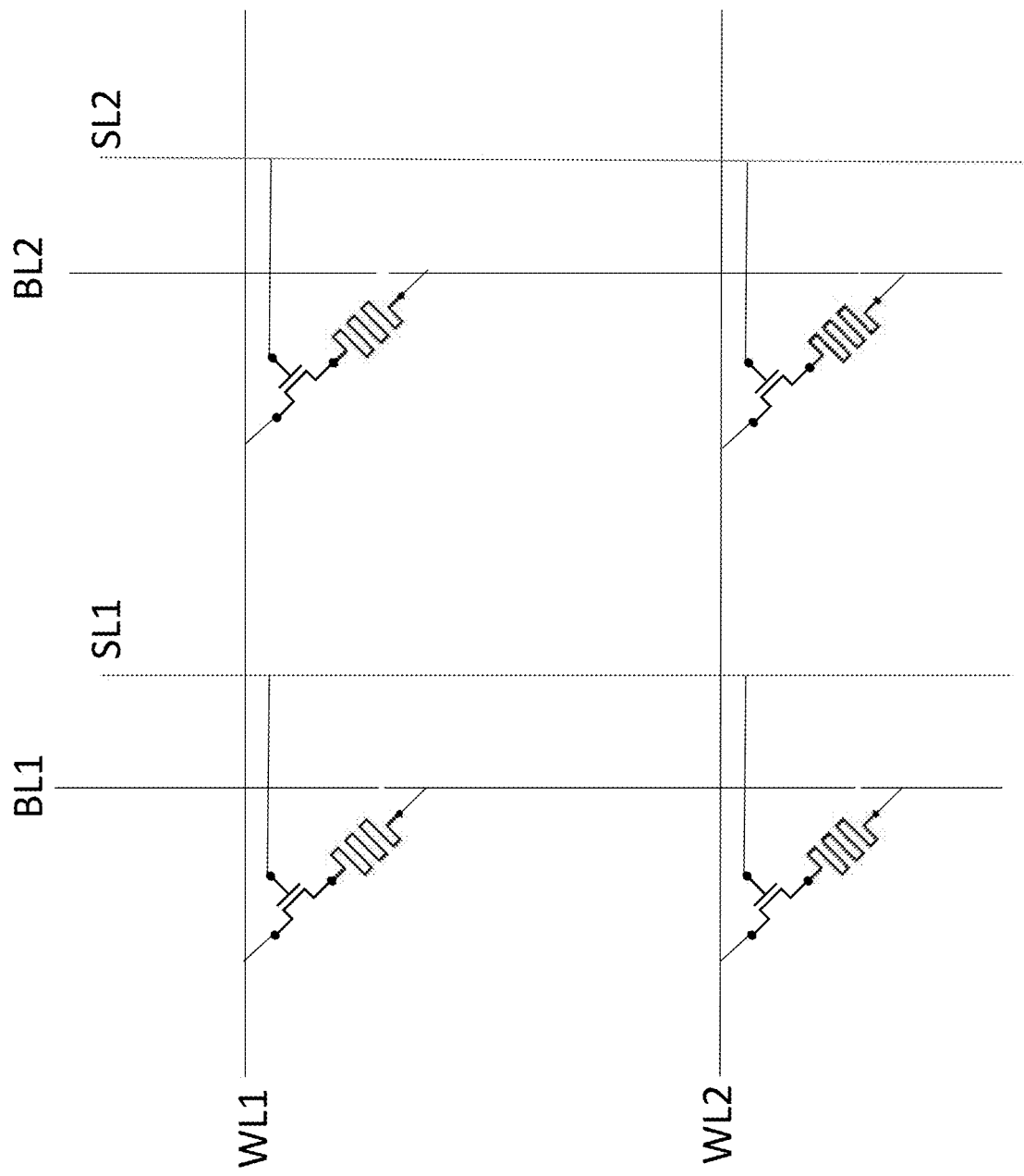
FIG. 1C is a block diagram illustrating an example 1T1R crossbar array.

FIG. 1C is a block diagram illustrating an example 1T1R crossbar array. Horizon wires or row wires may be referred to as Word Lines (WL), and vertical wires or column wires may be referred to as Bit Lines (BL).

Select Lines (SL) are connected to transistor gates. As mentioned before, two voltages, one applied to a gate and one applied to a drain, are required to flow a current through a transistor, and to program a RRAM cell connected to the transistor. By applying voltages to one Select Line (SL) and one Word Line (WL), current can flow a selected transistor and can program a selected RRAM cell.

Figure 1D:
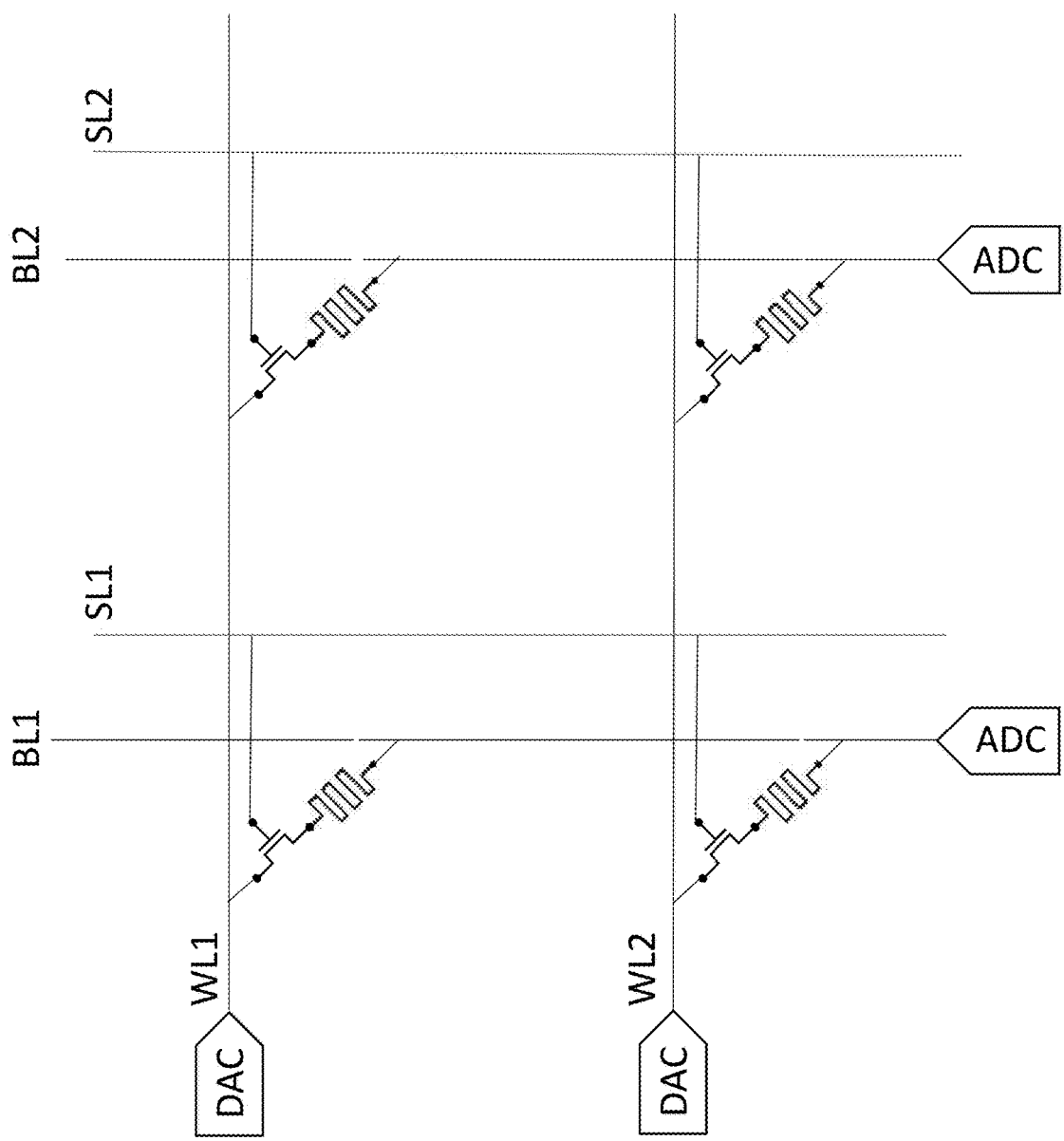
FIG. 1D is a block diagram illustrating an example 1T1R crossbar array with DAC and ADC circuits.

FIG. 1D is a block diagram illustrating an example 1T1R crossbar array with DAC and ADC circuits. As can be seen, the chip area overhead from using DACs and ADCs may be significant. Usually, the estimated area overhead may be greater than 95% for a 128×128 crossbar array. By using 1T2R crossbar arrays proposed in this disclosure, a single set of DAC and ADC may be used to support 2 crossbar arrays. Each crossbar can store a matrix of conductance as weights. The manufacturing cost associated with using DAC/ADC circuits may therefore be cut in half.

Figures 2A, 2B:
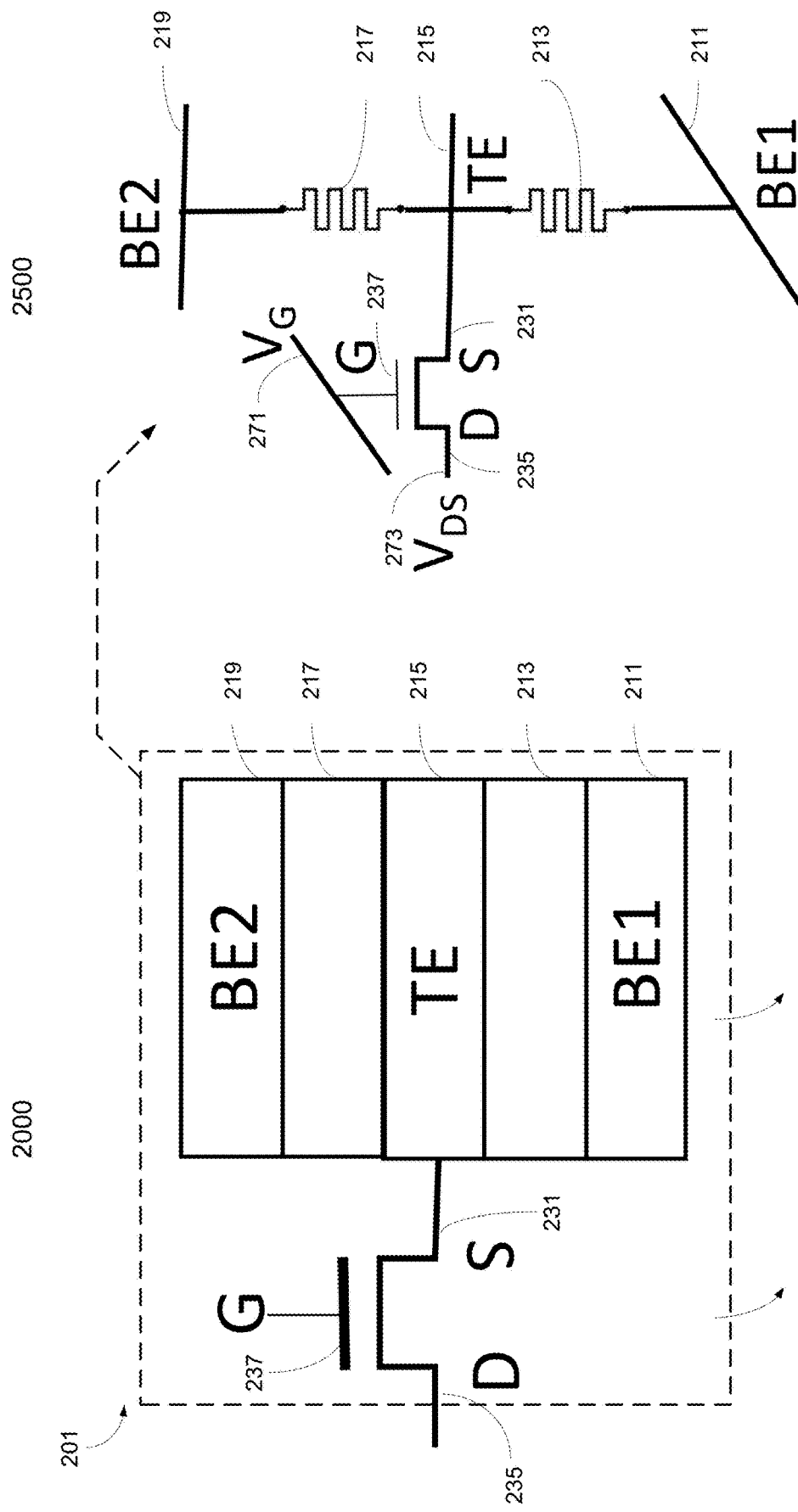
FIG. 2A is a block diagram illustrating an example 1T2R RRAM structure including a two-memristor (2R) structure and a one-transistor (1T) structure connected to form the 1T2R structure in accordance with some implementations of the present disclosure.
FIG. 2B is a block diagram illustrating the example 1T2R RRAM structure shown in FIG. 2A connected with voltage sources in accordance with some implementations of the present disclosure.

FIG. 2A is a block diagram 2000 illustrating an example 1T2R RRAM structure 201, which includes a two-memristor (2R) structure 250 and a one-transistor (1T) structure 255 connected to the 2R structure 250.

FIG. 2B is a block diagram 2500 illustrating the example 1T2R RRAM structure shown in FIG. 2A connected with voltage sources in accordance with some implementations of the present disclosure.

As shown in FIG. 2A, in the 2R structure 250, a first bottom electrode 211 is provided, a first RRAM stack 213 is formed on the first bottom electrode 211, a top electrode 215 is formed on the first RRAM stack 213, a second RRAM stack 217 is formed on the top electrode 215, and a second bottom electrode 219 is formed on the second RRAM stack 217.

The top electrode 215 is a common electrode between the first RRAM stack 213 and the second RRAM stack 217. In some implementations, the top electrode 215 is a reactive or scavenge electrode (e.g., a metal electrode with oxygen solubility) or a non-switching electrode, which is configured to create or provide oxygen vacancies in oxide near the top electrode. Therefore, the top electrode 215 is connected to a Conductive Filament (CF) of the first RRAM stack 213 and the second RRAM stack 217 during both HRS and LRS. The Bottom Electrode (BE1 and BE2) is designated as a switching electrode or non-reactive electrode which is relatively noble to oxygen. The bottom electrode may be connected to the CF during LRS, but not during HRS.

In some implementations, as illustrated in FIG. 2B, in the 1T structure 255, a first transistor electrode 231 (e.g., a source electrode) is provided and connected to the top electrode 215, a second transistor electrode 237 (e.g., a gate electrode 237) is connected to a first voltage source 271 (e.g., a gate source 271 with a voltage $V_G$), and a third transistor electrode 235 is connected to a second voltage source 273 (e.g., a drain-source voltage $V_{DS}$), as shown in FIG. 2B, which is a block diagram 2000 illustrating the example 1T2R RRAM structure shown in FIG. 2A connected with voltage sources in accordance with some implementations of the present disclosure.

An example difference between the 1T1R structure shown in FIG. 1B and the 1T2R structure shown in FIG. 2A is the addition of a second RRAM stack 217 and a second bottom electrode 219 for 1T2R, and the transistor utilization is doubled with a 1T2R structure.

The first bottom electrode 211, in some implementations, is made of materials including: Pt, Pd, Ir, Ru, TiN, TaN, a combination thereof, or an alloy or other conductive materials thereof.

The second bottom electrode 219, in some implementations, is made of materials including: Pt, Pd, Ir, Ru, TiN, TaN, a combination thereof, or an alloy or other conductive materials thereof.

The top electrode 215, in some implementations, is made of materials including: Ta, Hf, Zr, Ti, Nb, Ru, a combination thereof, or an alloy or other conductive materials thereof.

The first RRAM stack 213, in some implementations, is made of materials including: $TaO_x$, $HfO_x$, $TiO_x$, $ZrO_x$, a combination thereof, or an alloy or other conductive materials thereof.

The second RRAM stack 217, in some implementations, is made of materials including: $TaO_x$, $HfO_x$, $TiO_x$, $ZrO_x$, $TaO_xN_y$, $HfO_xN_y$, $TiO_xN_y$, $ZrO_xN_y$, $TaSi_xO_y$, $HfSi_xO_y$, $TiSi_xO_y$, $ZrSi_xO_y$, $TaAl_xO_y$, $HfAl_xO_y$, $TiAl_xO_y$, $ZrAl_xO_y$, a combination thereof, or an alloy or other conductive materials thereof.

In some implementations, the first RRAM stack 213 is made of a material that is different from the material of which the second RRAM stack 217 is made, for example, when the second RRAM stack 217 (or alternatively the first RRAM stack 213) operates as a current limiter. This feature is discussed in greater detail below with reference to FIGS. 3 and 4.

Figure 3:
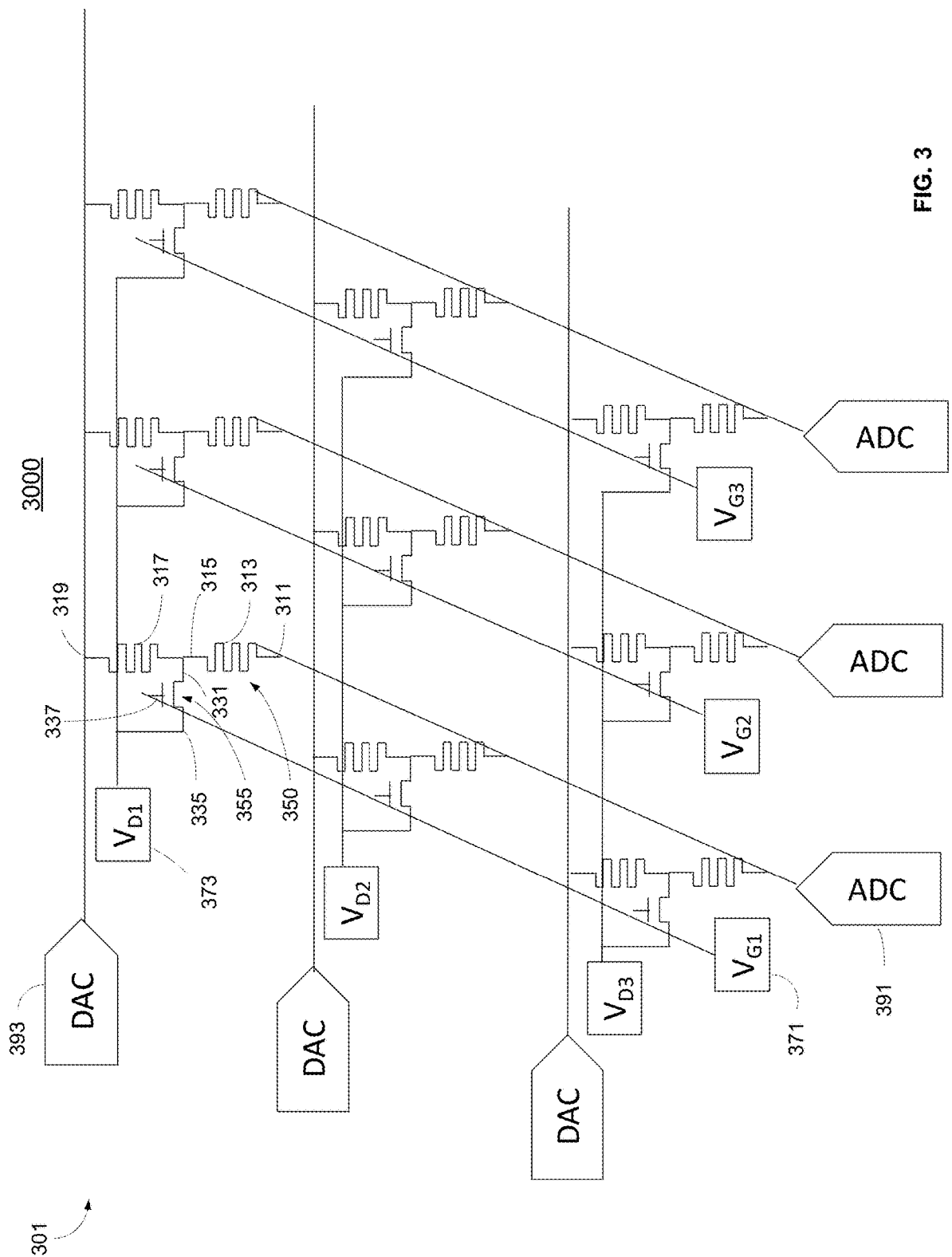
FIG. 3 is a block diagram illustrating an example 1T2R RRAM crossbar array circuit in accordance with some implementations of the present disclosure.

FIG. 3 shows a block diagram 3000 illustrating an example 1T2R RRAM crossbar array circuit 301 in accordance with some implementations of the present disclosure.

The first 1T2R RRAM crossbar array circuit 301 includes a 1T structure 355 and a 2R structure 350. The 2R structure 350 includes a first bottom electrode 311, a first RRAM stack 313 formed on the first bottom electrode 311, a top electrode 315 formed on the first RRAM stack 313, a second RRAM stack 317 formed on the top electrode 315, and a second bottom electrode 319 formed on the second RRAM stack 317.

The top electrode 315 is a common electrode between the first RRAM stack 313 and the second RRAM stack 317. In some implementations, the top electrode 315 is a reactive electrode, or scavenge electrode (a metal electrode with oxygen solubility) or a non-switching electrode, which creates oxygen vacancies in oxide near the top electrode. Therefore, the top electrode 315 is connected to a Conductive Filament (CF) of the first RRAM stack 313 and the second RRAM stack 317 in both in HRS and LRS.

In some implementations, the 1T structure 355 includes a first transistor electrode 331 (e.g., a source electrode 331) connected to the top electrode 315, a second transistor electrode 337 (e.g., a gate electrode 337) is connected to a first voltage source 371 (e.g., a gate source 371 with a voltage $V_{G1}$), and a third transistor electrode 335 is connected to a second voltage source 373 (e.g., a drain source 373 with a voltage $V_{D1}$). Furthermore, the first 1T2R RRAM crossbar array circuit 301 includes a first DAC 393 connected to the second bottom electrode 319, and a first ADC 391 connected to the first bottom electrode 311.

In some implementations, the second RRAM stack 317 functions as a current limiter. For example, the second RRAM stack 317 may provide a resistance that is one order greater than the resistance of the first RRAM stack 313. The first RRAM stack 313 may provide an analog resistance (e.g., when the first RRAM stack 313 is set to LRS) to reduce VMM operation current by at least 1 order.

The lower the conductance in LRS filamentary mode of analog RRAM operations, the lower the power consumption and the greater the performance (for example, reliability and uniformity) during the VMM operation. Therefore, the first 1T2R RRAM crossbar array circuit 301 as shown with reference to FIGS. 2 and 3 of the present disclosure enhances the efficiency of vector-matrix multiplication.

Figure 4:
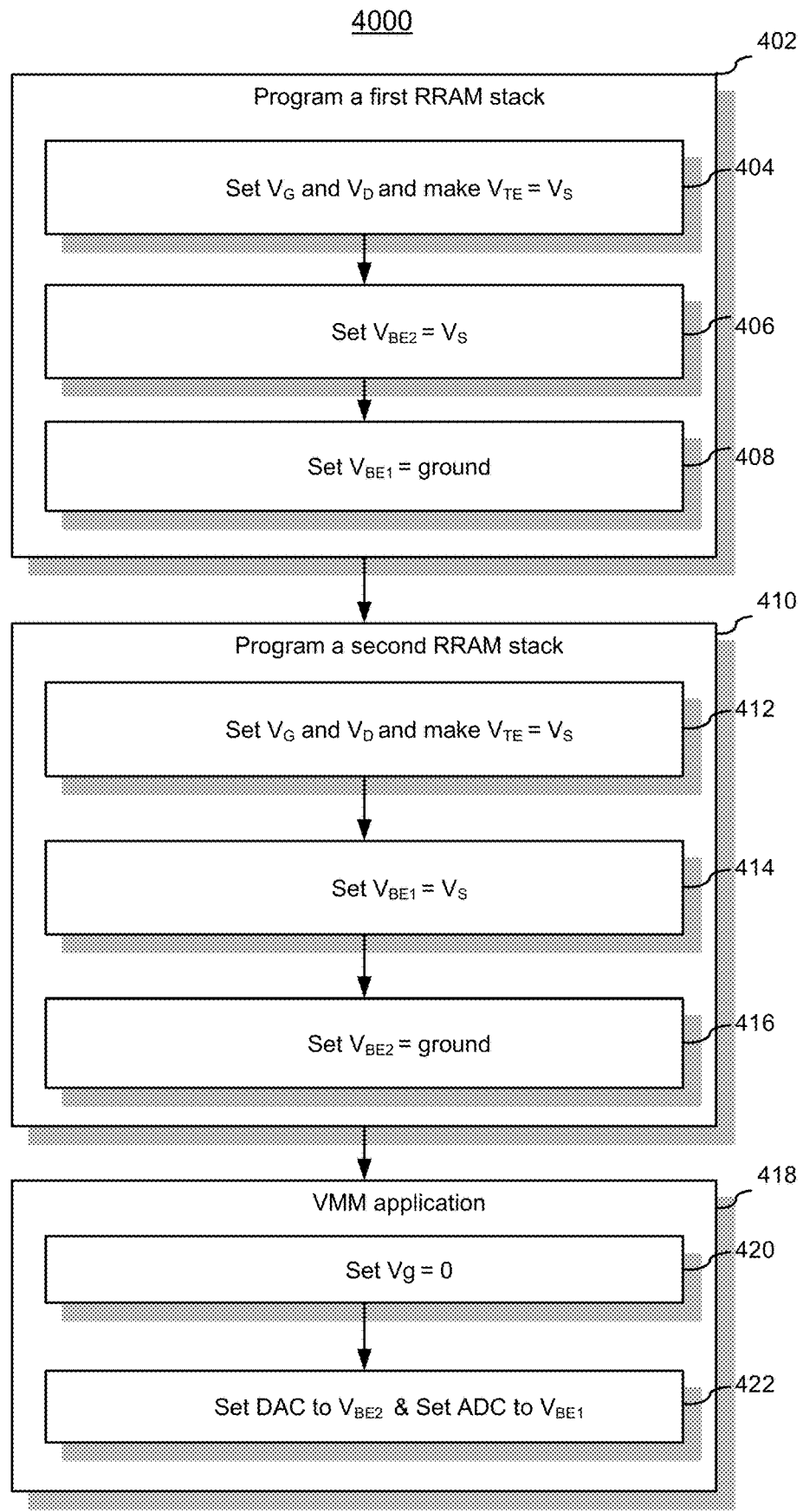
FIG. 4 is a block diagram illustrating an example method for programming the example 1T2R RRAM crossbar array circuit shown in FIG. 3.

FIG. 4 is a block diagram illustrating an example method 4000 for programming the example 1T2R RRAM crossbar array circuit shown in FIG. 3.

(1) Program the first RRAM stack 313 (402), which includes:

Set $V_G$ and $V_D$, make $V_{TE}=V_S$ (404);

Set $V_{BE2}=V_S$ (no current in the second RRAM stack 317) (406); and

Set $V_{BE1}$=ground (408). The first RRAM stack 313 can be set or reset under voltage bias $V_S$.

(2) Program the second RRAM stack 317 (410), which includes:

Set $V_G$ and $V_D$, make $V_{TE}=V_S$ (412);

Set $V_{BE1}=V_S$ (no current in the first RRAM stack 313) (414);

Set $V_{BE2}$=ground (416). The second RRAM stack 317 can be set or reset under voltage bias $V_S$.

(3) VMM application (418), which includes:

Set $V_G$=0, so the 1T structure 355 is OFF (no current may flow through) (420).

Set DAC output to BE2, set ADC input to BE1.

Because the first RRAM stack 313 and the second RRAM stack 317 are connected in serial, R=$R_1$+$R_2$, where $R_1$ and $R_2$ represent the resistances of the first RRAM stack 313 and the second RRAM stack 317, respectively.

VMM: V·G=I (422), where V represents an input voltage vector, G represents an analog RRAM conductance matrix, I represents an output, and · represents dot multiplication of V and G.

Since $R_1$ and $R_2$ are in serial, the serial resistance R=$R_1$+$R_2$ is increased, and the conductance G=1/R is decreased, and the current I, as a dot product of V and G, is also decreased.

Therefore, if $R_2$ is set 1 order larger than $R_1$, the VMM current may be reduced by at least 1 order. The second RRAM stack 317 (or alternatively the first RRAM stack 313) may work as a current limiter to reduce the VMM operation current. It should be noted the first RRAM stack 313 may be made from a material that is different from the material of which the second RRAM stack 317 is made, for example, when the second RRAM stack 317 (or alternatively the first RRAM stack 313) functions as a current limiter. In some implementations, when $R_2$ is set 1 order larger than $R_1$, the second RRAM stack 317 may be selected to have a resistance to be one order higher than that of the first RRAM stack 313.

In the implementations where $R_1=R_2$, the total resistance from of the 1T2R cell is doubled, and the current flows through the 1T2R cell is halved.

Figure 5:
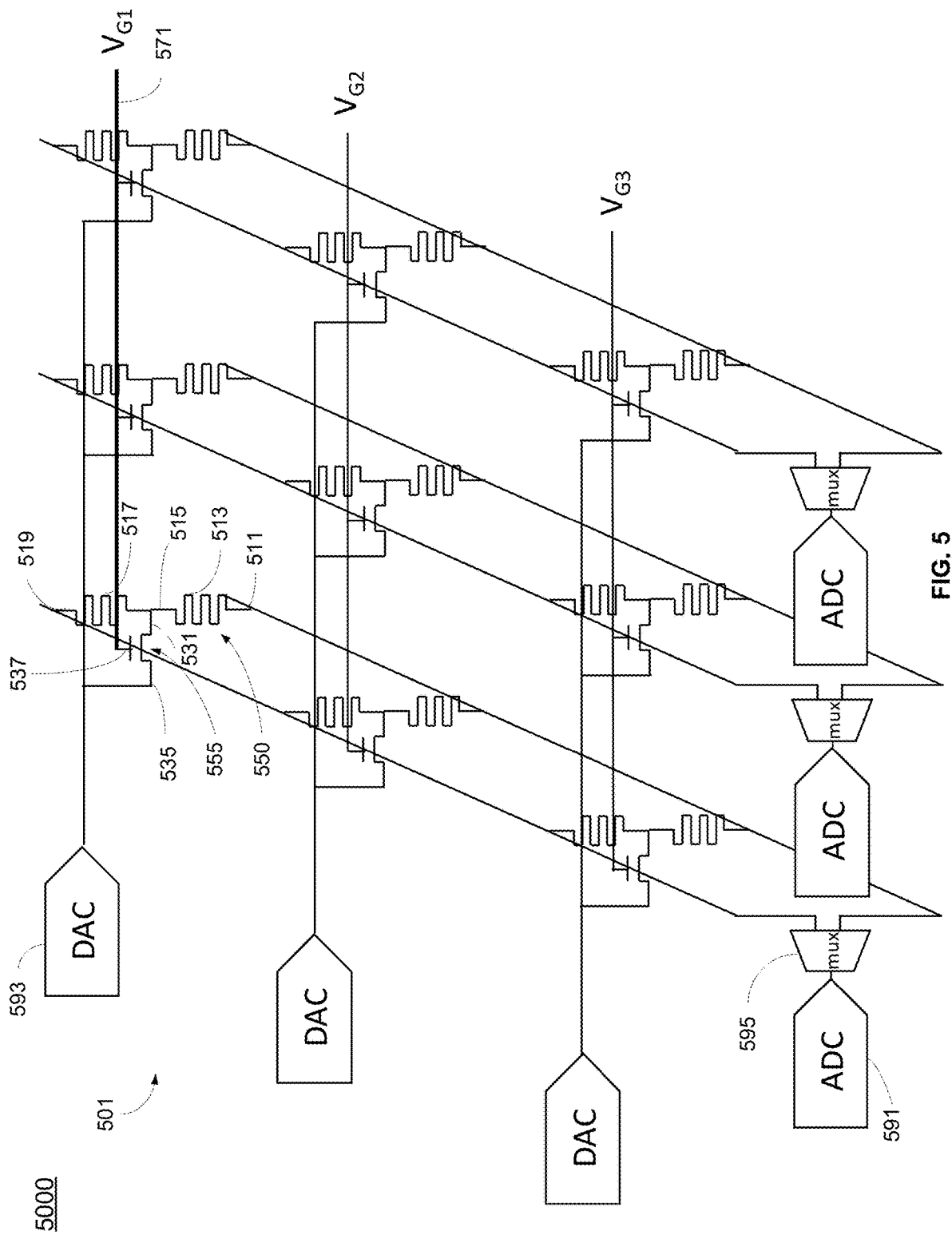
FIG. 5 is a block diagram illustrating an example 1T2R RRAM crossbar array circuit in accordance with some implementations of the present disclosure.

FIG. 5 is a block diagram 5000 illustrating a second example 1T2R RRAM crossbar array circuit 501 in accordance with some implementations of the present disclosure.

A shown in FIG. 5, the second 1T2R RRAM crossbar array circuit 501 includes a 1T structure 555 and a 2R structure 550, The 2R structure 550 includes a first bottom electrode 511, a first RRAM stack 513 is formed on the first bottom electrode 511, a top electrode 515 is formed on the first RRAM stack 513, a second RRAM stack 517 is formed on the top electrode 515, and a second bottom electrode 519 is formed on the second RRAM stack 517. The top electrode 515 is a common electrode between the first RRAM stack 513 and the second RRAM stack 517. In some implementations, the top electrode 515 is a reactive electrode or a scavenge electrode (metal electrode with oxygen solubility) or a non-switching electrode which creates oxygen vacancies in oxide near the top electrode. Therefore, the top electrode 515 is connected to a conductive filament (CF) of the first RRAM stack 513 and the second RRAM stack 517 in both in HRS and LRS.

Meanwhile, the 1T structure 555 includes a first transistor electrode 531 (e.g., a source electrode 531) connected to the top electrode 515, a second transistor electrode 537 (e.g., a gate electrode 537) is connected to a first voltage source 571 (e.g., a gate source 571 with a voltage $V_{G1}$), and a third transistor electrode 535. Furthermore, the second 1T2R RRAM crossbar array circuit 501 includes a first DAC 593 connected to the third transistor electrode 535, and a first ADC 591 connected to the first bottom electrode 511 and the second bottom electrode 519 via a first MUX 595.

In some implementations, the first MUX 595 is configured to select an input signal between the first bottom electrode 511 and the second bottom electrode 519 and forward the input signal to the first ADC 591.

Conventionally, the area overhead from DACs and ADCs are significant in an RRAM crossbar array circuit. It is estimated that the area overhead of DACs and ADCs are greater than 95% for a 128×128 crossbar array. Comparing 1T2R structure shown in FIG. 5 to 1T1R structure shown in FIG. 1D, one set of DAC and ADC circuits can support two cross bar arrays in FIG. 5, and only one crossbar arrays in FIG. 1D. Therefore, by using the second 1T2R RRAM crossbar array circuit 501 which supports two crossbar arrays with each crossbar array may store a different matrix value set (e.g., the first RRAM stack 513 and the second RRAM stack 517) in one set of DACs (e.g., the first DAC 593) and ADCs (e.g., the first ADC 591), the in-memory computing-capacity may be doubled.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A crossbar array circuit comprising:
   a two-memristor structure, wherein the two-memristor structure comprises:
   a first bottom electrode;
   a first RRAM stack formed on the first bottom electrode;
   a top electrode formed on the first RRAM stack;
   a second RRAM stack formed on the top electrode; and
   a second bottom electrode formed on the second RRAM stack, wherein the top electrode is a reactive electrode which is configured to provide the first RRAM stack and the second RRAM stack with oxygen vacancies near the reactive electrode; and
   a one-transistor structure, wherein the one-transistor structure comprises:
   a source electrode;
   a gate electrode; and
   a drain electrode, wherein the source electrode is connected to the top electrode.

2. The crossbar array circuit as claimed in claim 1, wherein the top electrode is made of a material including: Ta, Hf, Zr, Ti, Nb, Ru, a combination thereof, or an alloy or other conductive materials thereof.

3. The crossbar array circuit as claimed in claim 1, wherein the first bottom electrode and the second bottom electrode is made of a material including Pt, Pd, Ir, Ru, TiN, TaN, a combination thereof, or an alloy or other conductive materials thereof.

4. The crossbar array circuit as claimed in claim 1, wherein the first RRAM stack is made of a material including: $TaO_x$, $HfO_x$, $TiO_x$, $ZrO_x$, a combination thereof, or an alloy or other conductive materials thereof.

5. The crossbar array circuit as claimed in claim 1, wherein the second RRAM stack is made of a material including: $TaO_x$, $HfO_x$, $TiO_x$, $ZrO_x$, $TaO_xN_y$, $HfO_xN_y$, $TiO_xN_y$, $ZrO_xN_y$, $TaSi_xO_y$, $HfSi_xO_y$, $TiSi_xO_y$, $ZrSi_xO_y$, $TaAl_xO_y$, $HfAl_xO_y$, $TiAl_xO_y$, $ZrAl_xO_y$, or any combination or alloy of other electrically conductive materials thereof.

6. The crossbar array circuit as claimed in claim 1, wherein the second RRAM stack is made of a material that is the same as or different from the material from which the first RRAM stack is made.

7. The crossbar array circuit as claimed in claim 6, wherein the second RRAM stack is selected to have an LRS resistance to be in the same range to one order more than that of the first RRAM stack.

8. The crossbar array circuit as claimed in claim 1, wherein the gate electrode is connected to a first voltage source, and the drain electrode is connected to a second voltage source.

9. The crossbar array circuit as claimed in claim 8, further comprises:
   a first DAC connected to the second bottom electrode; and
   a first ADC connected to the first bottom electrode.

10. A crossbar array circuit comprising:
    a two-memristor structure, wherein the two-memristor structure comprises:
    a first bottom electrode;
    a first RRAM stack formed on the first bottom electrode;
    a top electrode formed on the first RRAM stack;
    a second RRAM stack formed on the top electrode; and
    a second bottom electrode formed on the second RRAM stack, wherein the top electrode is a reactive or scavenging electrode which is configured to provide the first RRAM stack and the second RRAM stack with oxygen vacancies near the reactive electrode;
    a one-transistor structure, wherein the one-transistor structure comprises:
    a source electrode;
    a gate electrode; and
    a drain electrode, wherein the source electrode is connected to the top electrode, and the gate electrode is connected to a first voltage source;
    a first DAC connected to the drain electrode;
    a MUX connected to the first bottom electrode and the second bottom electrode; and
    a first ADC connected to the MUX, wherein the MUX is configured to select an input signal between the first bottom electrode and the second bottom electrode and forward the input signal to the first ADC.

* * * * *